(12) United States Patent
Kryliouk et al.

(10) Patent No.: US 6,906,351 B2
(45) Date of Patent: Jun. 14, 2005

(54) GROUP III-NITRIDE GROWTH ON SI SUBSTRATE USING OXYNITRIDE INTERLAYER

(75) Inventors: Olga Kryliouk, Gainesville, FL (US); Timothy J. Anderson, Gainesville, FL (US); Michael Anthony Mastro, Alexandria, VA (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 10/634,220

(22) Filed: Aug. 5, 2003

(65) Prior Publication Data

US 2005/0032345 A1 Feb. 10, 2005

(51) Int. Cl.$^7$ ............................................... H01L 29/22
(52) U.S. Cl. ....................................... 257/78; 438/604
(58) Field of Search .................... 257/78, 79; 438/604

(56) References Cited

U.S. PATENT DOCUMENTS 5,563,428 A * 10/1996 Ek et al. ...................... 257/77

OTHER PUBLICATIONS

Nikishin et al., "High quality GaN grown on Si(111) by gas source molecular beam epitaxy with ammonia," Applied Physics Letters, 75:2073–2075, 1999.
Zhang et al., "Enhanced optical emission from GaN films grown on a silicon substrate," Applied Physics Letters, 74:1984–1986, 1999.
Linthicum et al., "Process Routes For Low Defect–Density Gan On Various Substrates Employing Pendeo–Epitaxial Growth Techniques," MRS Internet J. Nitride Semicond. Res. 4S1, G4.9, 1999.
Strittmatter et al., "Low–pressure metal organic chemical vapor deposition of GaN on silicon(111) substrates using an AlAs nucleation layer," Applied Physics Letters, 74:1242–1244, 1999.
Sanchez–Garcia et al., "Ultraviolet electroluminescence in GaN/AlGaN single–heterojunction light–emitting diodes grown on Si(111)," Journal of Applied Physics, 87:1569–1571, 2000.
Kryliouk et al., "Single Crystal GaN Substrate Grown by Hydride–Metal Organic Vapor Phase Epitaxy (H–MOVPE)," Electromechanical Society Proceedings, 98–18:99–107, 1998.
Lukas et al., "Optimization of Phase Diagrams by a Least Squares Method Using Simultaneously Different Types of Data," CALPHAD, 1:225–236, 1977.
Sundman et al., "The Thermo–Calc Databank System," CALPHAD, 9:153–190, 1985.

* cited by examiner

*Primary Examiner*—Thao P. Le
(74) *Attorney, Agent, or Firm*—Akerman Senterfitt

(57) ABSTRACT

A layered article and method for forming the same includes a single crystal silicon substrate, a silicon oxynitride layer ($Si_xN_yO_z$) disposed on the silicon substrate, and a single crystal GaN layer disposed on the oxynitride layer. The silicon oxynitride layer can be formed by nitridation of a native oxide layer. One or more integrated electronic circuits and/or integrated optical or optoelectronic devices can be built on the article.

7 Claims, 16 Drawing Sheets

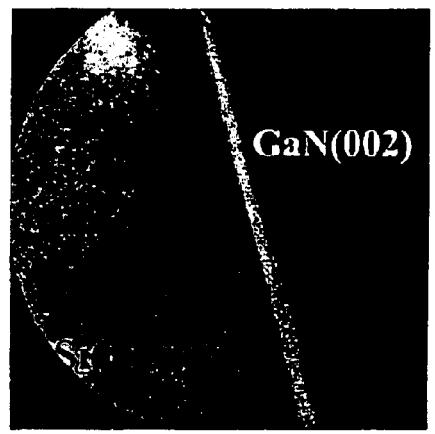
FIG. 12(a)　　　　　　　FIG. 12(b)
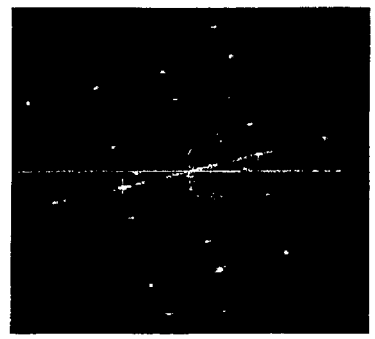
FIG. 12(c)

GROUP III-NITRIDE GROWTH ON SI SUBSTRATE USING OXYNITRIDE INTERLAYER

CROSS-REFERENCE TO RELATED APPLICATIONS

Not Applicable

STATEMENT REGARDING FEDERALLY SPONSORED RESEARCH OR DEVELOPMENT

Not Applicable

FIELD OF THE INVENTION

The invention relates the field of thin film based devices, and more specifically, to a method of improving the quality of Group III-N thin films which have poor lattice matching with the substrate onto which it is to be deposited and related articles.

BACKGROUND OF THE INVENTION

Group III-N compounds, such as gallium nitride (GaN) and its related alloys have been under intense research in recent years due to their promising applications in electronic and optoelectronic devices. Particular examples of potential optoelectronic devices include blue light emitting and laser diodes, and UV photodetectors. Their large bandgap and high electron saturation velocity also make them excellent candidates for applications in high temperature and high-speed power electronics.

Due to the high equilibrium pressure of nitrogen at growth temperatures, it is extremely difficult to obtain GaN bulk crystals. Owing to the lack of feasible bulk growth methods, GaN is commonly deposited epitaxially on substrates such as SiC and sapphire ($Al_2O_3$). However, a current problem with the manufacture of GaN thin films is that there is no readily available suitable substrate material which exhibits close lattice matching and close matching of thermal expansion coefficients.

SiC is an excellent thermal conductor, but is very expensive and only available in small wafer sizes. Presently, (0001) oriented sapphire is the most frequently used substrate for GaN epitaxial growth due to its low price, availability of large-area wafers with good crystallinity and stability at high temperatures. However, the lattice mismatch between GaN and sapphire is over 13%. Such huge mismatch in the lattice constants causes poor crystal quality if GaN films were to be grown directly on the sapphire, due to stress formation and a high density of defects, including such defects as microtwins, stacking faults and deep-levels. Typically, these GaN thin films exhibit wide X-ray rocking curve, rough surface morphology, high intrinsic electron concentration and significant yellow luminescence.

The most highly refined semiconductor substrate in the world are silicon wafers. Silicon is increasingly being used as a substrate for GaN materials. Silicon substrates have been considered for use as substrates for growth of GaN films. Silicon substrates for GaN growth is attractive given its low cost, large diameter, high crystal and surface quality, controllable electrical conductivity, and high thermal conductivity. The use of Si wafers promises easy integration of GaN based optoelectronic devices with Si based electronic devices.

The disadvantages of Si as a substrate for GaN heteroepitaxy include a +20.5% a-plane misfit which initially led to the conclusion that growth of GaN directly on silicon was not likely to work well. In addition, the thermal expansion misfit between GaN ($5.6 \times 10^{-6} K^{-1}$) and Si ($6.2 \times 10^{-6} K^{-1}$) of 9.6% can lead to cracking upon cooling for films grown at high temperature. Thus, direct growth of GaN on substrates including Si has been found to result in either polycrystalline growth, substantial diffusion of Si into the GaN film and/or a relatively high dislocation density (e.g. $10^{10}$ cm$^{-2}$). Moreover, GaN is also known to poorly nucleate on Si substrates, leading to an island-like GaN structure and poor surface morphology. Thus, the quality of GaN films grown on silicon has been far inferior to that of films grown on other commonly used substrates such as sapphire or silicon carbide. Moreover, the growth conditions that have been used for GaN on Si are generally not compatible with standard silicon processing.

Numerous different buffer layers have been disclosed for insertion between the substrate and the GaN layer to relieve lattice strain and thus improve GaN crystal quality. Thin AlN, GaAs, AlAs, SiC, $SiO_2$, $Si_3N_4$ and ZnO or low-temperature GaN layers have been used as a buffer layers for GaN growth on Si. However, even when buffer layers are used, the thermal expansion co-efficient mismatch is typically too large to suppress the formation of cracks in the GaN and other related Group III-N films grown on silicon.

SUMMARY OF THE INVENTION

A layered article includes a single crystal silicon substrate, a silicon oxynitride layer ($Si_xN_yO_z$) disposed on the silicon substrate, and a single crystal group III-N layer, such as GaN, disposed on the oxynitride layer. The silicon substrate can be (111) oriented, such as for hexagonal (0001) oriented GaN. However, silicon oxynitride can be formed on silicon substrates having any orientation. The single crystal group III-nitride layer can be a GaN layer. The thickness of the silicon oxynitride layer is preferably from 15 to 40 angstroms. An integrated electronic circuit, integrated optical or optoelectronic device can be built on the article.

A method for forming group III-nitride layer including articles comprises the steps of providing a single crystal silicon comprising substrate, the silicon substrate having a silicon dioxide layer disposed thereon, converting the silicon dioxide layer to a silicon oxynitride ($Si_xN_yO_z$) layer, and then depositing a single crystal group III-nitride layer on the oxynitride layer. The silicon dioxide layer can be a native oxide layer. The converting step can comprise flowing $NH_3$ at a temperature below 575° C., such as a temperature of between 550 and 575° C. The converting step and the depositing step can occur in the same reactor. Both the converting step and the depositing step can be performed in a temperature range from 550 to 575° C. However, once an oxynitride layer is disposed on the silicon surface, GaN or other group III-nitride layers can be deposited at temperatures of 900° C. or more.

In one embodiment, a $H_2$ clean step at a temperature of at least 500° C. is performed prior to the converting step. The silicon oxynitride layer can be formed by nitridation of a native oxide layer. As used herein, the phrase "native oxide layer" refers to the silicon dioxide layer that forms on the surface of a silicon wafer from exposure to oxygen at or near room temperature.

BRIEF DESCRIPTION OF THE DRAWING

A fuller understanding of the present invention and the features and benefits thereof will be accomplished upon review of the following detailed description together with the accompanying drawings, in which:

FIGS. 12(a)–12(c) show high resolution TEM images showing an oxynitride layer formed at the substrate/film interface for GaN on Si(111) for 900° C. MOVPE.

DETAILED DESCRIPTION OF THE INVENTION

Figure 1:
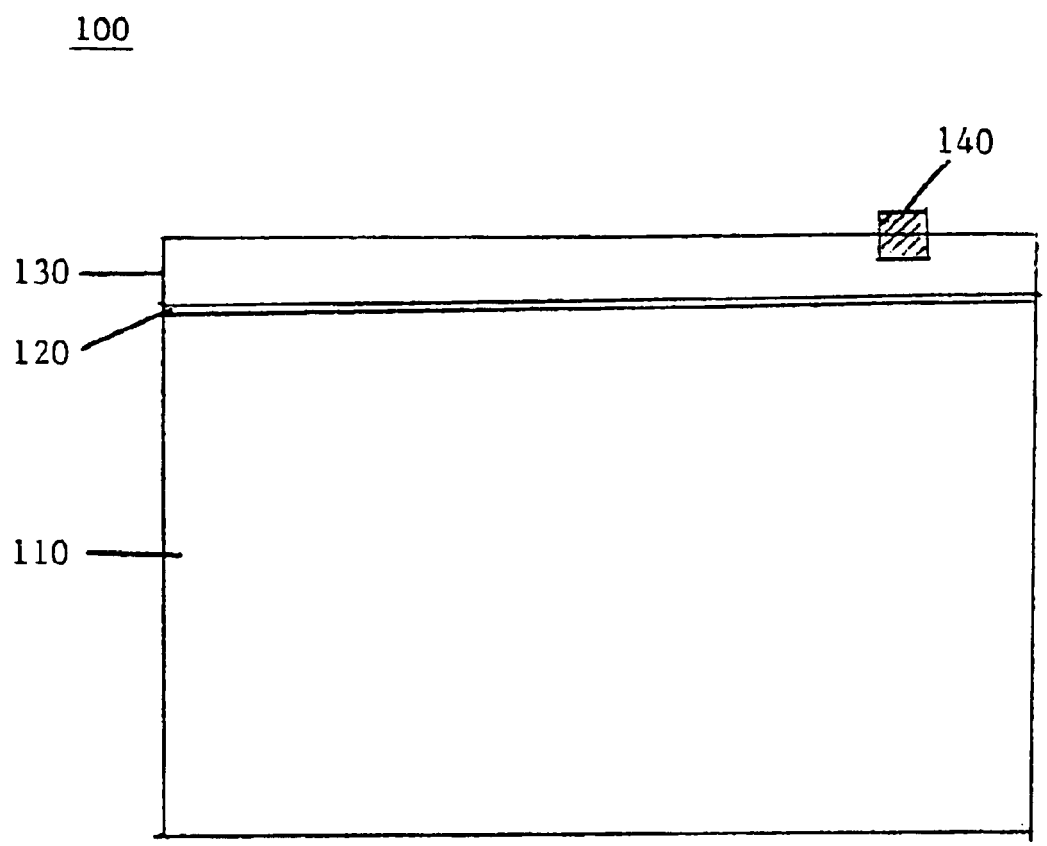
FIG. 1 shows a layered article including a single crystal silicon substrate, a thin silicon oxynitride layer (SixNyOz) disposed on the silicon substrate, and a single crystal Group III-N layer, according to an embodiment of the invention.

The invention relates methods of depositing Group III-N compounds on silicon comprising substrates and related articles. As shown in FIG. 1, a layered article 100 includes a single crystal silicon substrate 110, a thin silicon oxynitride layer (SixNyOz) 120 disposed on the silicon substrate, and a single crystal Group III-N layer 130, such as a GaN layer, disposed on the oxynitride layer 120. The silicon oxynitride layer (SixNyOz) 120 is defined as a silicon comprising layer including both Si—O and Si—N bonds. The silicon oxynitride layer 120 may be stoichiometric, such as $Si_2N_2O$, or may be non-stoichiometric. The thickness of the silicon oxynitride layer 120 is generally from about 15 to 40 angstroms. One or more integrated electronic circuits and/or integrated optical or optoelectronic devices 140 can be built on article 100.

The silicon oxynitride interface layer 120 protects the Si substrate 110 from reaction with GaN reagents at the growth temperature and also relieves stress at the substrate-film interface thus preventing the formation of GaN layer cracks. The invention thus eliminates the need for a conventional buffer layer yet provides high structural quality single crystal GaN. Although not required, one or more layers (not shown) can be disposed between the oxynitride layer 120 and the Group III-N layer 130.

Although the invention is described relative to Si substrates and generally the (111) orientation, other substrates and substrate orientations can be used with the invention. Preferred substrates provide a native oxide layer when exposed to oxygen.

The invention is generally described relative to articles including GaN on silicon comprising substrates. However, other III-V species, such as AlN, InN and their alloys, as well as GaN alloys can generally be used with the invention.

Although the invention is generally described through the formation of a silicon oxynitride layer (SixNyOz) by nitridation of a native silicon dioxide layer, the native oxide layer can be replaced or supplemented by a grown or deposited oxide layer. For example, a dry oxidation step can be used to form a thin silicon dioxide layer, such as 20 to 50 angstroms, that can then be nitridized. Alternatively, it may be possible to deposit a silicon oxynitride layer rather than form the same through nitridation of an oxide layer.

Using the invention, single crystal GaN can be deposited on Si (111) effectively without any intervening buffer layer by a two-step process, such as for depositing hexagonal (0001) oriented GaN. However, silicon oxynitride can be formed according to the invention on silicon substrates having any orientation. In the first step, the native oxide surface of the silicon wafer is nitridized to form a thin and compliant silicon oxynitride layer (SixNyOz). The silicon oxynitride layer is generally a non-crystalline layer. For example, the silicon oxynitride layer can be formed by flowing a reactive nitrogen containing gas (e.g. $NH_3$) at a temperature of about 560° C. for 15 to 30 minutes. GaN or other related Group III-N compounds such as InGaN, AlGaN, AlInGaN are then deposited, preferably in the same reactor used for the nitridation using a Hydride Vapour Phase Epitaxy (HVPE) process at 560 to 900° C. for 120 to 300 minutes. The oxynitride layer disposed on the silicon surface permits single crystal GaN or other group III-nitride layers to be deposited at deposition temperatures of 900° C. or more. GaN deposition at a temperature of 560° C. may be the lowest deposition temperature reported for single crystal GaN by vapor phase epitaxy.

It was determined that optimal GaN growth occurred when the Si substrate was cleaned in warm trichloroethylene (TCE)/acetone/methanol and etched for one minute in dilute HF (1%). This permits a clean native oxide layer to grow of the silicon surface. This is preferably followed by an in-situ hydrogen reduction (4% $H_2$ in $N_2$) for ten minutes at the growth temperature before the nitridation of the silicon dioxide layer to form the oxynitride layer. The hydrogen reduction conditions should be chosen to avoid removal of substantially all the native oxide layer.

Before a proper substrate preparation procedure was developed it was observed that GaN growth performed at intermediate temperature (approximately 700 to 800° C.) or high temperature (approximately 850 to 950° C.) exhibited cracking and was polycrystalline. Surprisingly, only the low temperature (560° C.) growth produced crack-free films of single-crystal quality. A thermodynamic assessment of the Ga—N—O—Si system was performed using the available software to understand the chemistry at the Si/GaN interface.

Figure 2:
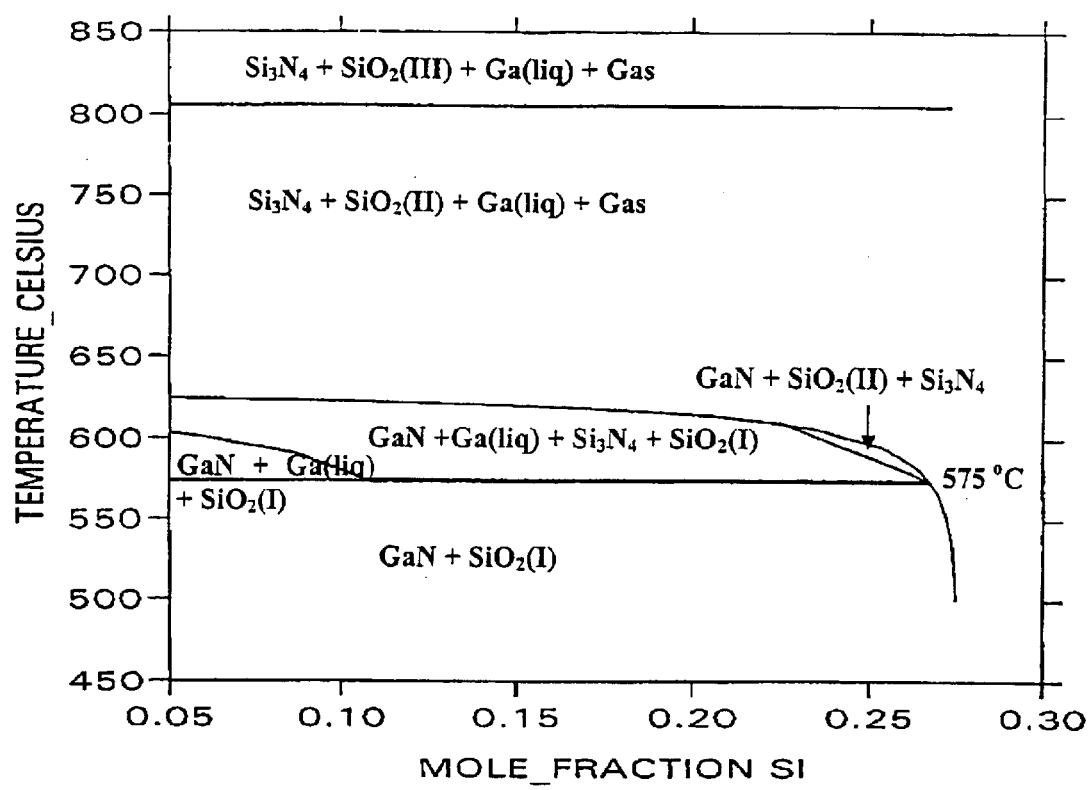
FIG. 2 is an equilibrium phase-diagram for the Ga—N—O—Si system.

An equilibrium phase diagram that displays temperature versus mole fraction of Si for the Ga—O—N—Si system is shown in FIG. 2. The phase diagram provides insight regarding physical-chemical reactions at the relevant interface and indicates that above 575° C., amorphous $SiN_x$ forms which is shown as $Si_3N_4$.

To model the thermodynamics at the initial stages of growth, the mole fraction of silicon was varied as an independent axis in FIG. 2 to simulate changing surface coverage. It was estimated that at the silicon surface the system could be defined with $P_{total}=1.0$ atm, $x_{Ga}=0.1$, $x_O=0.05$, and $x_N$ was the independent variable. Chlorine was not present, as the initial growth step was MOCVD. The temperature range studied was 500 to 950° C.

The phase diagram indicates that above 575° C., $SiN_x$ forms. Thus, even small amounts of $SiN_x$ at the interface cause polycrystalline growth of the subsequent GaN layer as observed for medium and high temperature GaN growth.

EXAMPLES

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

Two types of reactors were used to deposit GaN. The main reactor used was a hot-wall merged-hydride reactor that can alternate between MOCVD and HVPE. In some cases, a capping GaN layer was grown in an alternate reactor that is a traditional cold-wall, low-pressure system, referred herein as a MOVPE reactor. Growth conditions for the films were as follows: pressure: MOCVD @ 760 Torr, HVPE @ 760 Torr, MOVPE @ 76 Torr; V/III reactant ratio: MOCVD 3000, HVPE 125, MOVPE 3000; growth temperature: MOCVD 560 to 900° C., HVPE 560 to 900° C., MOVPE 560 to 850° C.

To understand the initial stages of GaN growth on Si, a thermal treatment study was undertaken. The effects of temperature, cleaning procedure, $H_2$ in-situ cleaning, and TMGa and $NH_3$ treatment on bare silicon substrates were studied.

Figure 3A:
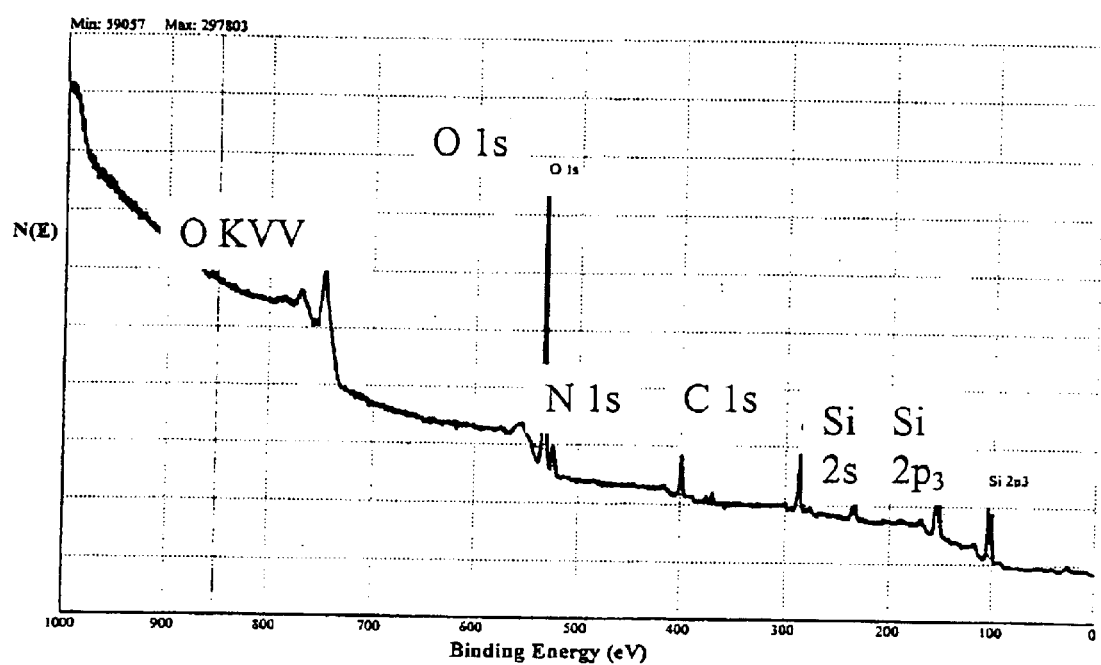
FIGS. 3(a) and 3(b) are ESCA spectra for silicon annealed at 900° C. in 1 slm of $N_2$ with 100 % $NH_3$ at 1 slm and without $NH_3$, respectively.
Figure 3B:
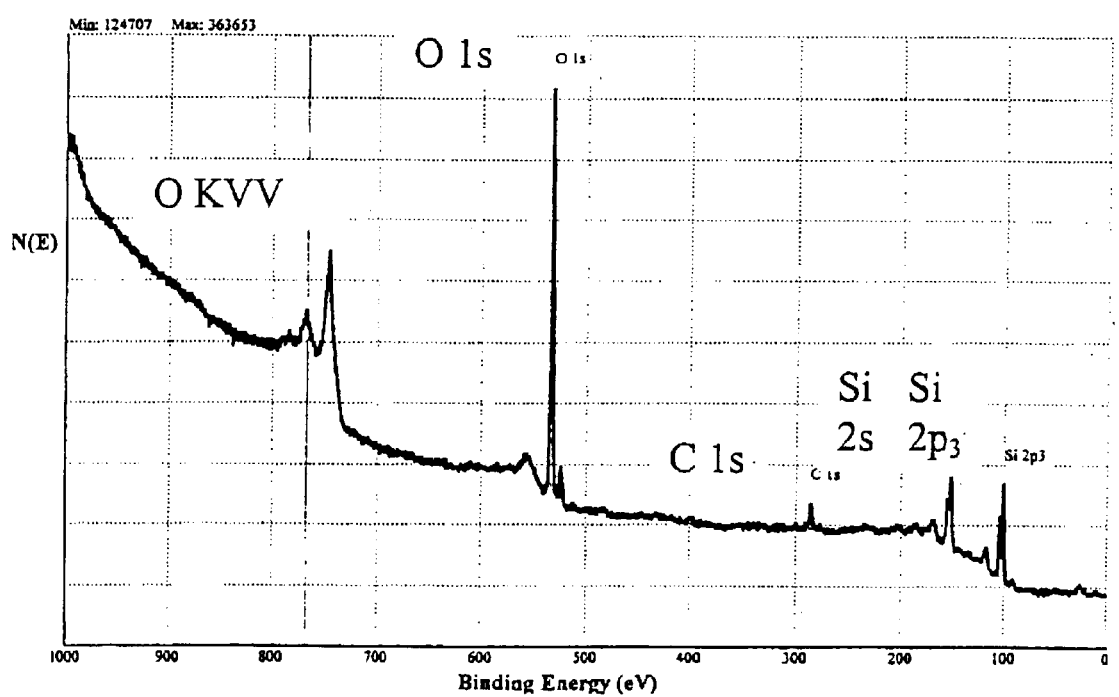

Pre-treating Si which includes a thin native oxide surface with $NH_3$ forms an oxynitride compound on the Si surface as evidenced by the ESCA spectrum shown in FIG. 3(a). The ESCA spectrum of FIG. 3(b) shows that without a $NH_3$ or other reactive nitrogen containing pre-treatment, no N is detected at the Si surface.

Figure 4A:
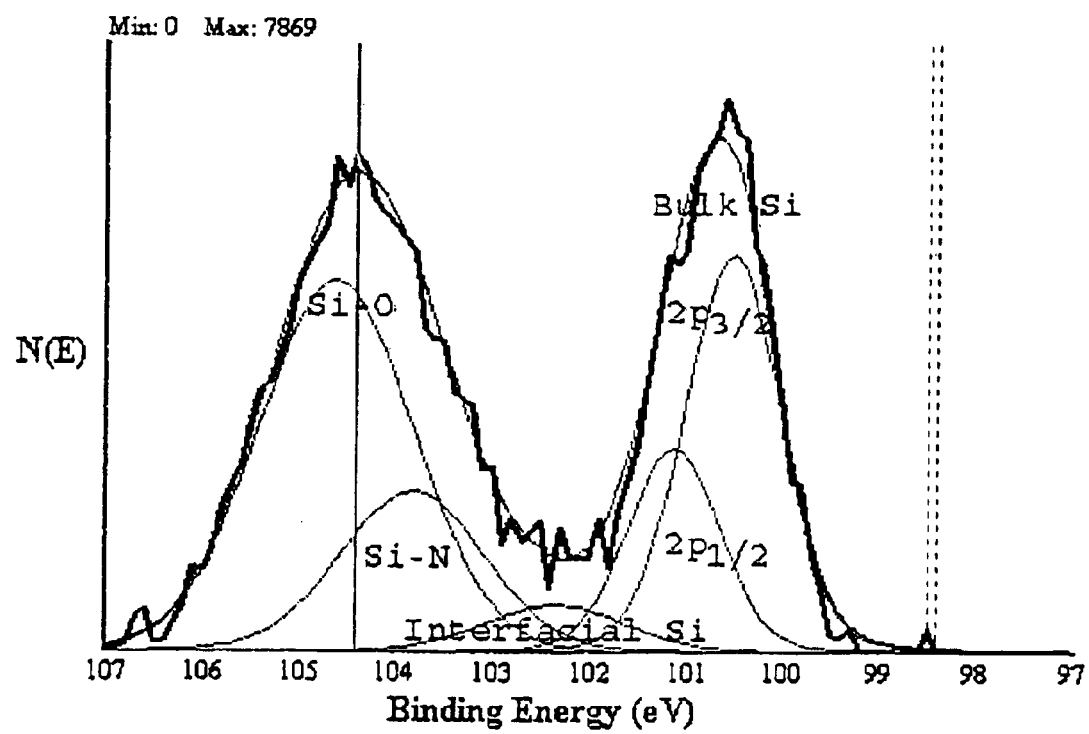
FIGS. 4(a) and 4(b) are ESCA spectra of the Si $2p_3$ peak for silicon annealed at 900° C. in 1 slm of $N_2$ with 100% $NH_3$ at 1 slm and without NH3, respectively.
Figure 4B:
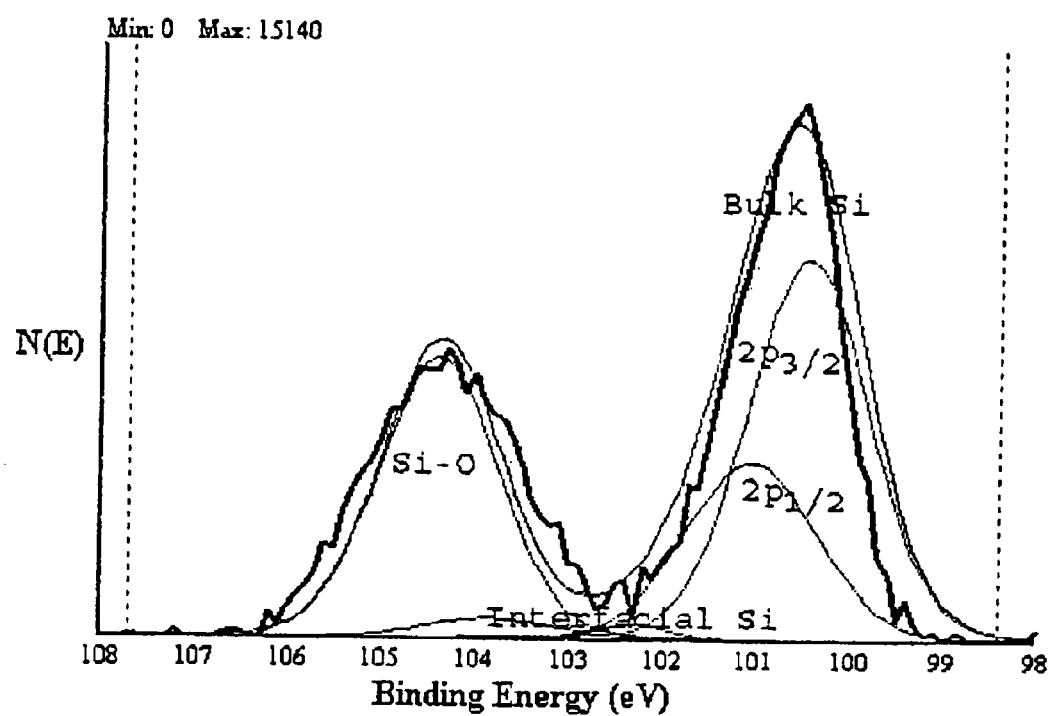
Figure 5A:
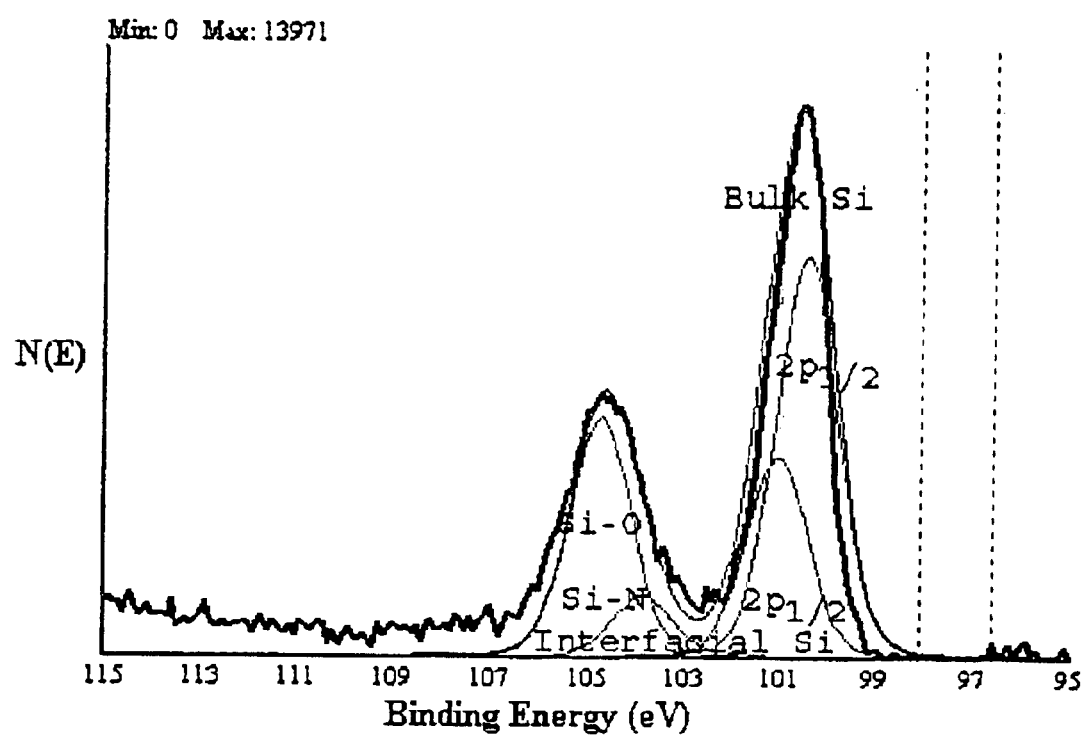
FIGS. 5(a) and 5(b) are ESCA spectra of Si $2p_3$ peak for silicon annealed at 560° C. in 1 slm of $N_2$ with 100% $NH_3$ at 1 slm and without $NH_3$, respectively.

FIGS. 4(a) and 4(b) show ESCA spectra of the Si $2p_3$ peak for bare silicon treated with and without $NH_3$ at high temperature (900° C.), while FIGS. 5(a) and (b) show the same at low temperature (560° C.). These samples were cleaned in warm trichloroethylene/ethanol/methanol, etched in 1% HF and in-situ cleaned in 4% $H_2$ at the anneal temperature. Analysis by ESCA was performed within 3 hr of the experimental run to minimize contamination from the ambient.

An advantage of ESCA is that it gives information on chemical states from variations in binding energies, or chemical shifts, of the photoelectron lines. Bulk Si—Si bonds have a binding energy at 100.1 eV. This peak shows a doublet splitting of the 2p subshell into $2p_{3/2}$ and $2p_{1/2}$ bands with an intensity ratio of 1:2. Emission of an electron with up or down spin from a p-type orbital creates a photoelectron with two possible energy levels. These two emission levels separated by 0.6 eV create an asymmetry in the overall Si peak.

Strained Si—Si bonds near the $Si/SiO_x$ interface are distorted from their typical tetragonal bonding configuration. This compressive distortion results in a silicon bonding peak shifted to 102.2 eV. A strong peak observed at 104.1 eV was assigned to the Si—O bond. For samples treated in ammonia, a strong peak from the Si—N bond was observed at 103.3 eV.

By integrating the area of each peak, an estimation of the bonding configuration of the surface atoms is possible. Table 1 shows the presence of Si—N Bonds for samples annealed in $NH_3$ that demonstrates that nitrogen incorporates into the $SiO_x$ film. The nitrogen incorporation is seen to increase with increasing anneal temperature consistent with either increased $NH_3$ decomposition or increased N diffusion at higher temperature.

TABLE 1

| Temperature | $NH_3$ | % Bulk Si Bonds | % Si—O Bonds | % Si—N Bonds |
|---|---|---|---|---|
| High (900° C.) | Yes | 40.2 | 38.8 | 16.2 |
| High (900° C.) | No | 64.6 | 31.5 | Negligible |
| Low (560° C.) | Yes | 66.0 | 26.4 | 6.8 |
| Low (560° C.) | No | 71.5 | 18.3 | Negligible |

Figure 5B:
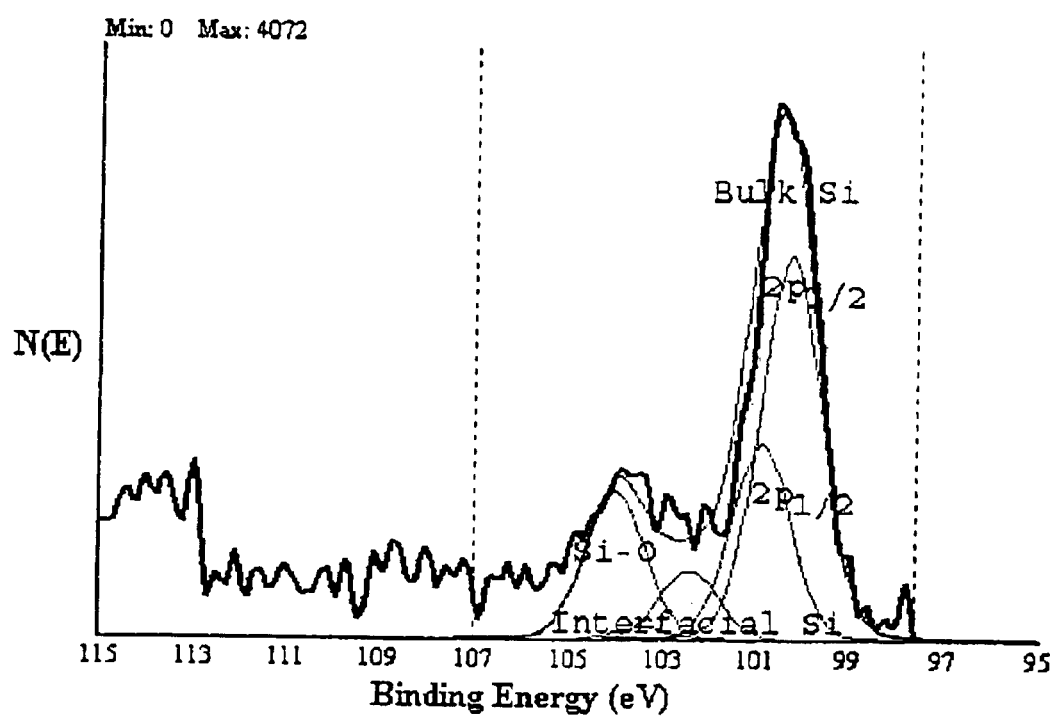

FIG. 5(b) shows ESCA spectrum results for warm TCE/ethanol/methanol clean, 1% HF etch, in-situ 4% $H_2$ clean followed by nitridation using $NH_3$ at 560° C. which resulted in the highest quality GaN epitaxy obtained. ESCA analysis indicates that the GaN was deposited on a thin SixNyOz film. Only the first 5 nm of the surface are probed in ESCA due to the small escape length of the photoelectrons. Thus, for all films an oxide or oxynitride thickness in the range of 2 nm to 3 nm can be estimated from the ratio of bulk Si bonding to silicon oxide bonding.

As noted above, avoiding formation of a SiNx layer at the Si surface allows growth of single crystal GaN. Based on FIG. 2, for GaN deposition on Si a temperature below 575° C. an amorphous SixNyOz layer that is thermodynamically favored to form is produced. Furthermore, ESCA analysis shows that undesirable N incorporation at the Si/GaN interface is reduced by decreasing the growth temperature and avoiding exposure of the Si surface to $NH_3$.

Figure 6A:
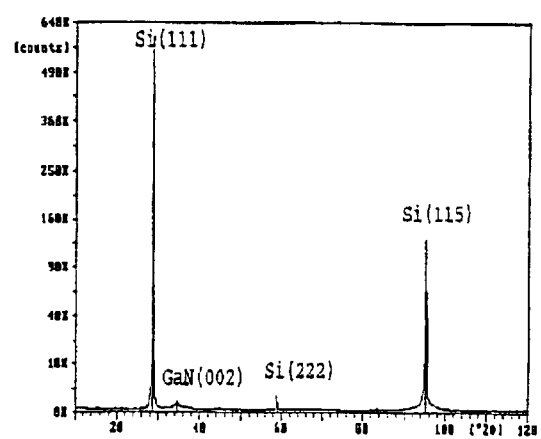
FIG. 6 is a low resolution XRD spectra for GaN on Si (111).
Figure 6B:
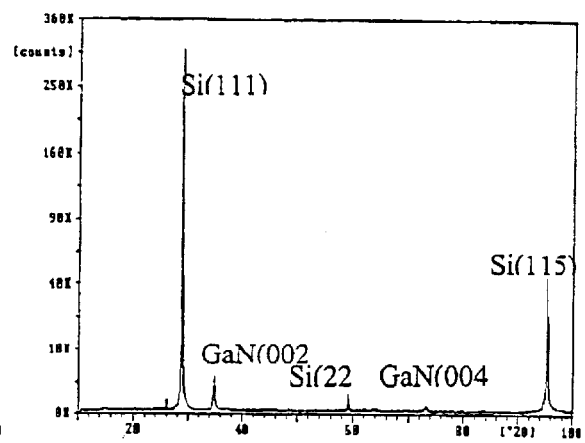
Figure 7:
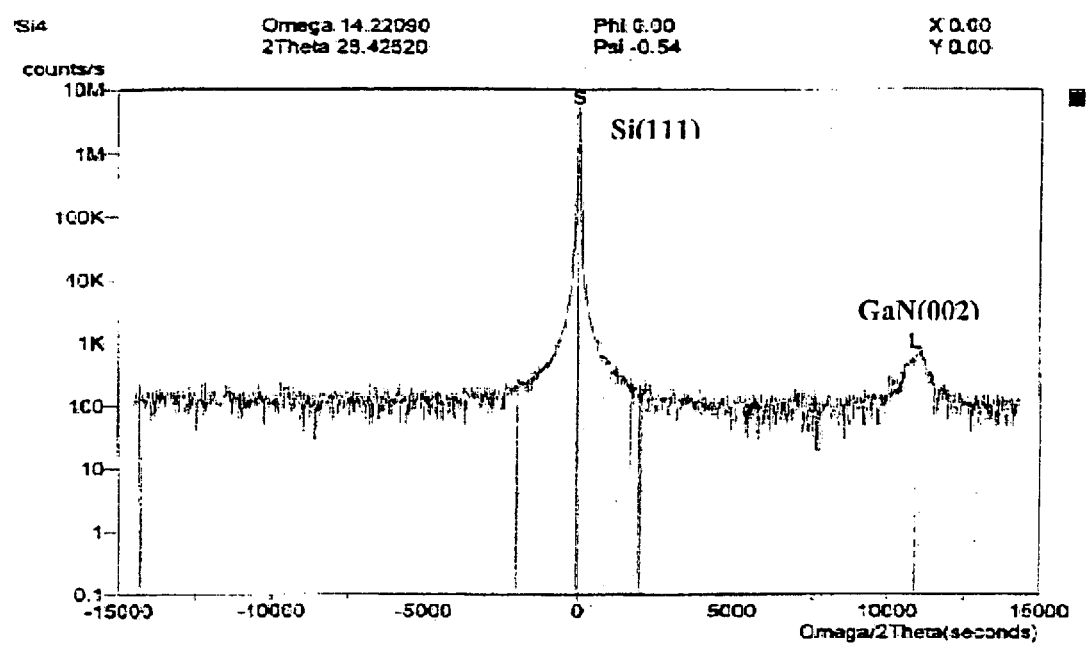
FIG. 7 is a high resolution XRD spectrum for GaN grown on Si (111).
Figure 8:
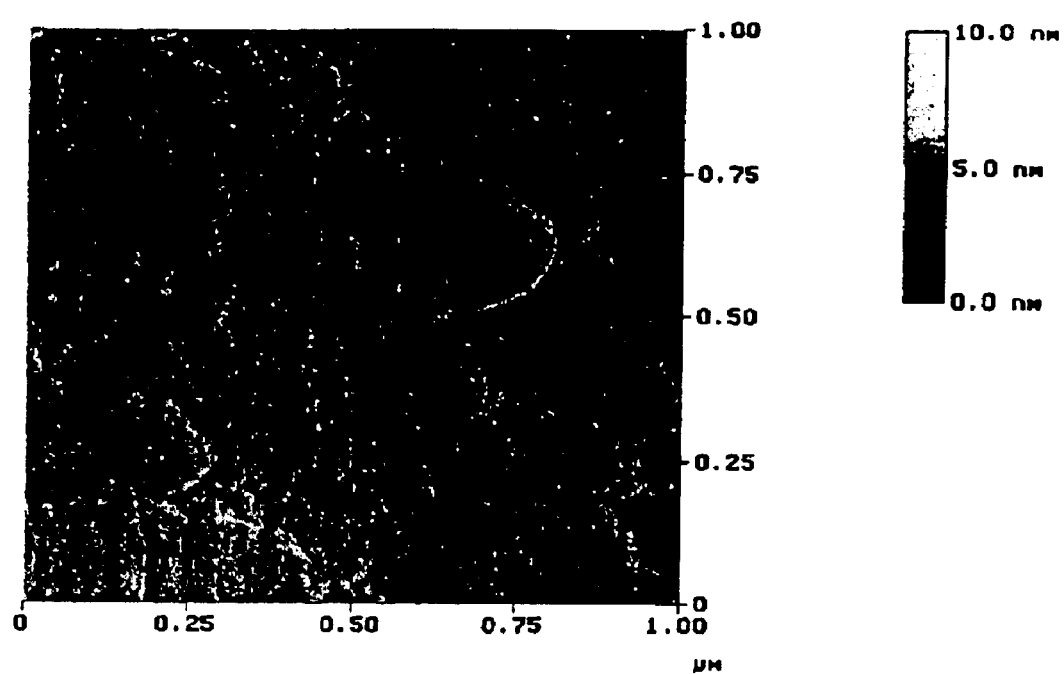
FIG. 8 is an AFM of GaN grown on (111) Si.

GaN can be deposited using a low temperature process throughout. However, as noted above, the oxynitride layer disposed on the silicon surface permits single crystal GaN or other group III-nitride layers to be deposited at deposition temperatures of 900° C. or more. For example, single-crystal, crack-free GaN layer on a silicon substrate was obtained by cleaning the wafers in warm TCE/Acetone/Methanol and then etching in HF (1%). An in-situ clean was then used comprising 4% hydrogen (10 min) at 560° C. followed by nitridation using $NH_3$ to form the oxynitride layer. The GaN films were grown in the sequence low temperature MOCVD layer (560° C., 15 min; $TEGa/NH_3$) followed by a low temperature HVPE GaN layer (560° C., 120 min; TMGa, HCl, $NH_3$). The strongest crystalline signal by low resolution XRD (see FIG. 6b) and the best high resolution XRD (see FIG. 7) FWHM results of 804.3 arc sec ($\omega/2\theta$ scan with open detector). All growths described had uniform coverage on 2" Si (111) substrates. Additionally, the GaN surface was specular and smooth as judged by visual inspection and the AFM shown in FIG. 8 which demonstrates an RMS roughness of 1.497 nm.

Figure 9:
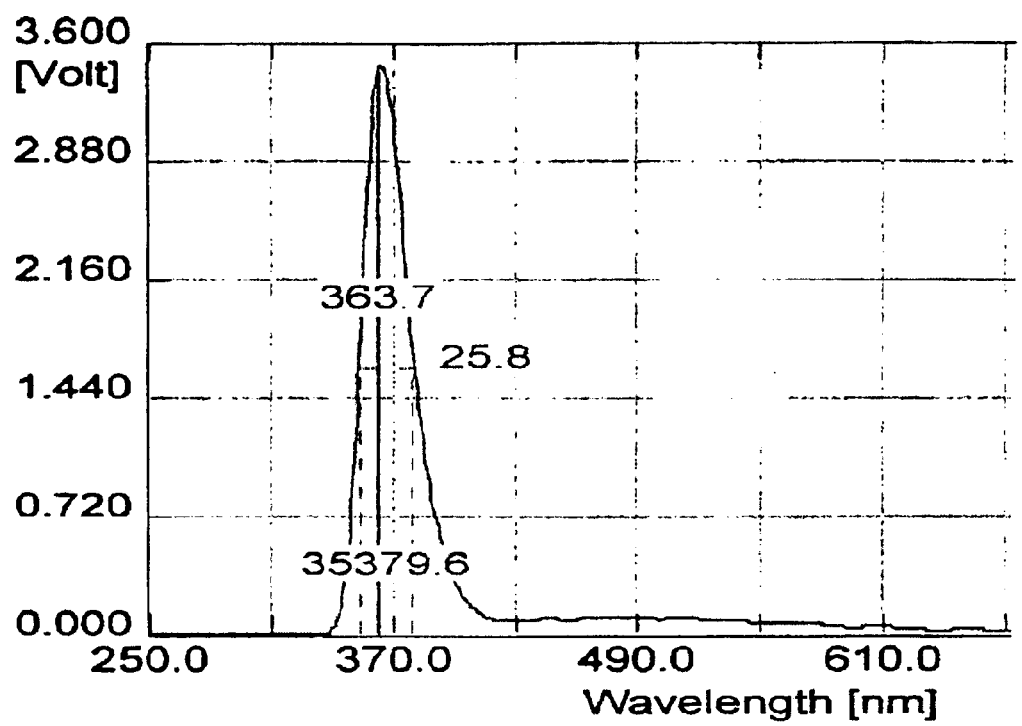
FIG. 9 is a room temperature photoluminescence (PL) spectrum of GaN grown on Si(111) at 560° C.

A typical room temperature PL spectrum is shown in FIG. 9. PL was performed exciting the sample a with 325 nm He—Cd laser, 6.9 mW, slit width 0.100 nm. The FWHM shown is 25.8 nm. The intensity of the band-edge emission peak at 3.41 eV was high and comparable to GaN grown on sapphire. The defect related yellow band emission was not detected.

Figure 10:
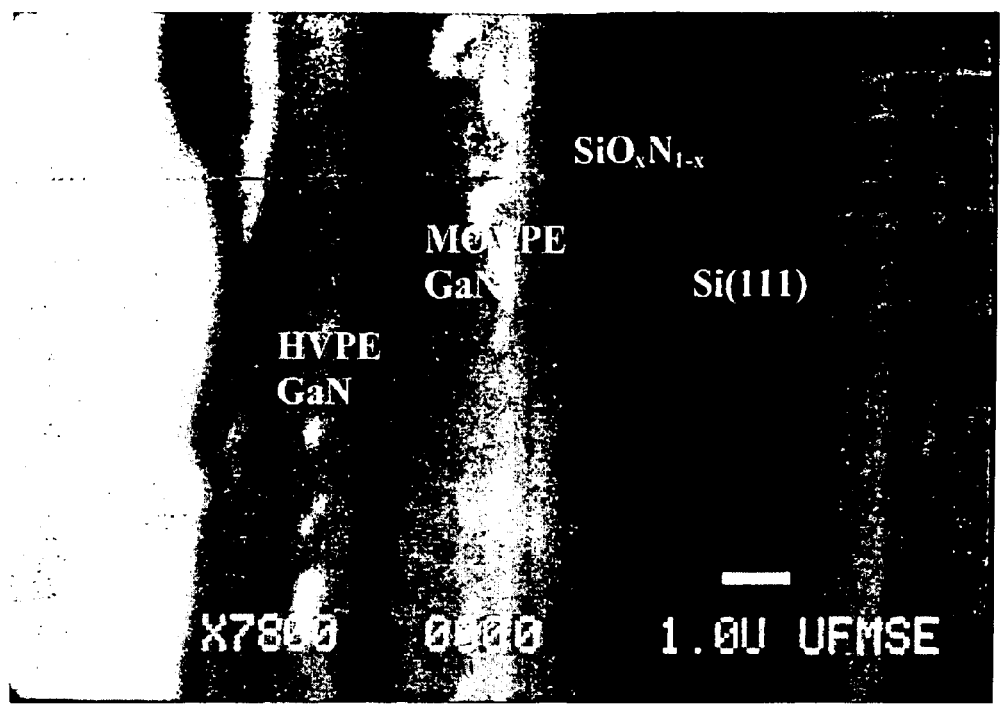
FIG. 10 shows a SEM of low-temperature MOCVD/HVPE GaN showing a silicon oxynitride layer.

A cross-sectional SEM micrograph depicted in FIG. 10 shows a sharp interface between the MOCVD and HVPE layers. GaN was grown on Si (111) without any buffer layer.

Clearly the HVPE growth rate was greatly reduced at low temperature. Most likely the reduced pyrolisis rate of TMGa combined with an etching mechanism by the large number of free chlorine atoms reduced the growth rate. Another possibility is the formation of adducts that reduce the amount of Ga atoms available to form GaN at the growth surface. The cross-sectional SEM micrograph in FIG. 10 indicates that the silicon oxynitride layer is approximately 10 nm in thickness. This thickness may be exaggerated by SEM contrast.

Figure 11A:
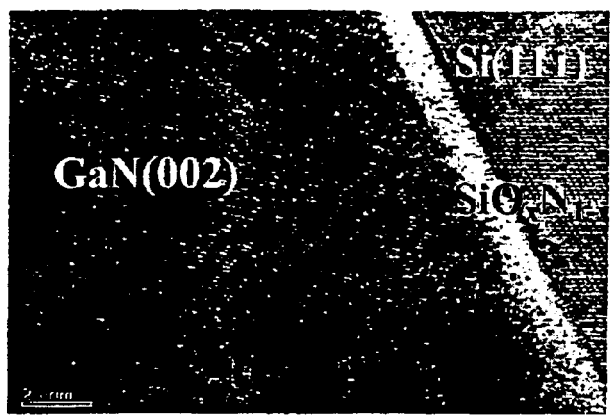
FIGS. 11(a) and 11(b) show high resolution TEM images showing about a 2 nm oxynitride layer formed at the substrate/film interface for GaN on Si(111) for 560° C. MOVPE followed by 560° C. HVPE.
Figure 11B:

FIG. 10 shows an SEM of low-temperature (560° C.) MOCVD/HVPE GaN. FIGS. 11(*a*) and (*b*) show high resolution TEM images showing about a 2 nm oxynitride layer formed at the substrate/film interface for GaN on Si(111) for 560 C MOVPE followed by 560° C. HVPE. FIGS. 12(*a*)–(*c*) show high resolution TEM images showing an oxynitride layer formed at the substrate/film interface for GaN on Si(111) for 900° C. MOVPE. The TEMs shown in FIG. 12 demonstrate that the oxynitride layer acts as a protective layer, preventing GaN reagents during GaN deposition from reacting with the silicon substrate at 900° C., which is not possible using a bare silicon substrate. The sharp selected area diffraction patterns in FIGS. 11(*b*) and 12(*c*) provide confirmation that the GaN film is single-crystal. The estimated thickness of the silicon oxynitride layer is less than 2 nm.

Figure 13:
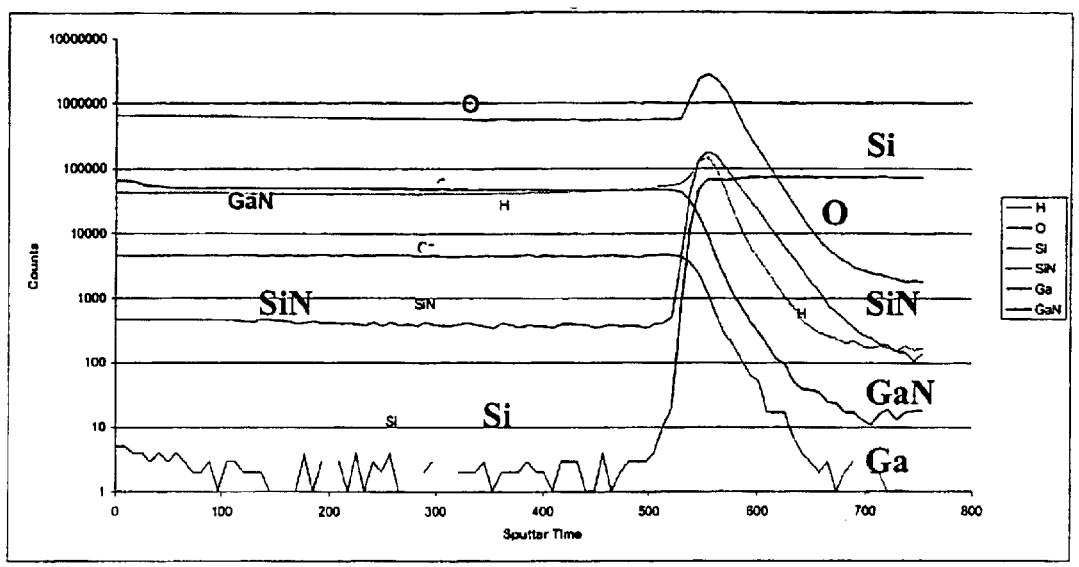
FIG. 13 is SIMS depth profile data indicating the formation of a silicon oxynitride layer at the GaN/Si interface for GaN grown on Si(111) at T=850° C.

FIG. 13 is a SIMS depth profile of GaN grown on Si(111) at T=850° C. Based on SIMS depth profile data, it is clear that intensities of SiN and O increased at GaN/Si interface. This evidences the formation of silicon oxynitride layer at the GaN/Si interface.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

What is claimed is:

1. A layered article, comprising:
    a single crystal silicon comprising substrate;
    a silicon oxynitride layer (SixNyOz) disposed on said silicon substrate, and
    a single crystal group III-nitride layer disposed on and in contact with said oxynitride layer, wherein a thickness of said silicon oxynitride layer is less than 100 angstroms.

2. The article of claim 1, wherein said silicon substrate is (111) oriented.

3. The article of claim 2, wherein said single crystal group III-nitride layer is a GaN layer.

4. The article of claim 1, wherein said thickness of said silicon oxynitride layer is from 15 to 40 angstroms.

5. The article of claim 1, further comprising an integrated electronic circuit built on said article.

6. The article of claim 1, further comprising an integrated optical or optoelectronic device built on said article.

7. The article of claim 1, wherein said thickness of said silicon oxynitride layer is from 15 to 50 angstroms.

* * * * *